United States Patent
Co et al.

(10) Patent No.: US 6,415,397 B1
(45) Date of Patent: *Jul. 2, 2002

(54) AUTOMATED MULTI-PC-MOTHERBOARD MEMORY-MODULE TEST SYSTEM WITH ROBOTIC HANDLER AND IN-TRANSIT VISUAL INSPECTION

(75) Inventors: Ramon S. Co, Trabuco Canyon; Steve Si-Yu Chen, San Jose; Fred Yen Kong, Irvine; Thang Nguyen, Santa Ana, all of CA (US)

(73) Assignee: Kingston Technology Company, Fountain Valley, CA (US)

( * ) Notice: Subject to any disclaimer, the term of this patent is extended or adjusted under 35 U.S.C. 154(b) by 126 days.

This patent is subject to a terminal disclaimer.

(21) Appl. No.: 09/660,714

(22) Filed: Sep. 13, 2000

Related U.S. Application Data

(63) Continuation-in-part of application No. 09/056,973, filed on Apr. 8, 1998, now Pat. No. 6,178,526.

(51) Int. Cl.[7] .................................................. H02H 3/05
(52) U.S. Cl. .......................................... 714/42; 714/718
(58) Field of Search .............................. 714/42, 29, 54, 714/718, 30, 767; 711/115, 170, 173; 710/102, 103

(56) References Cited

U.S. PATENT DOCUMENTS

| | | | |
|---|---|---|---|
| 4,688,939 A | 8/1987 | Ray | 356/237 |
| 5,489,852 A | 2/1996 | Gomez | 324/754 |
| 5,515,514 A | 5/1996 | Dhuey et al. | 395/282 |
| 5,568,593 A | 10/1996 | Demarest et al. | 395/82 |
| 5,598,345 A | 1/1997 | Tokura | 364/489 |
| 5,659,680 A | 8/1997 | Cunningham et al. | 395/183.01 |
| 5,666,049 A | 9/1997 | Yamada et al. | 324/158.1 |
| 5,680,536 A | 10/1997 | Tyuluman | 395/180 |
| 5,692,219 A * | 11/1997 | Chan et al. | 710/49 |
| 5,704,489 A | 1/1998 | Smith | 289/2 |
| 5,705,932 A | 1/1998 | Fredrickson | 324/754 |
| 5,734,551 A | 3/1998 | Hileman et al. | 361/695 |
| 5,852,617 A | 12/1998 | Mote, Jr. | 371/22.31 |
| 5,978,860 A * | 11/1999 | Chan et al. | 710/8 |
| 5,986,447 A | 11/1999 | Hanners et al. | 324/158.1 |
| 6,122,756 A * | 9/2000 | Baxter et al. | 714/30 |
| 6,175,774 B1 * | 1/2001 | Frank et al. | 700/79 |
| 6,178,526 B1 * | 1/2001 | Nguyen et al. | 714/42 |

* cited by examiner

Primary Examiner—Dieu-Minh Le
(74) Attorney, Agent, or Firm—Stuart T. Auvinen

(57) ABSTRACT

A test station for testing memory modules uses multiple personal computer (PC) motherboards for performing functional tests on the modules. The motherboards are mounted upside-down with the solder-side up at the desktop level of the test station frame. One or more of the memory-module sockets on each motherboard is removed. A test adaptor board is plugged into the holes of the removed socket, but mounted on the reverse, solder side of the motherboard rather than the component side. The test adaptor board has a test socket that receives a module being tested. An overhead robotic arm picks up memory modules from an input tray and inserts them into test sockets for testing by the motherboards. Since the cables, components, and expansion boards of the motherboards are hidden below the solder-side surface of the motherboards, while the test adaptor board is above, the overhead robotic arm can easily navigate to the test socket without obstruction. Modules that pass are inspected in transit when the robotic arm holds the module in front of a camera that sends images to an image inspection processor.

20 Claims, 8 Drawing Sheets

AUTOMATED MULTI-PC-MOTHERBOARD MEMORY-MODULE TEST SYSTEM WITH ROBOTIC HANDLER AND IN-TRANSIT VISUAL INSPECTION

RELATED APPLICATION

This application is a continuation-in-part of the application for "Testing Memory Modules with a PC Motherboard Attached to a Memory-Module Handler by a Solder-Side Adaptor Board", U.S. Ser. No. 09/056,973, filed Apr. 8, 1998 now U.S. Pat No. 6,178,526.

FIELD OF THE INVENTION

This invention relates to electronic test systems, and more particularly to robotic testers for memory modules including SIMMs and DIMMs.

BACKGROUND OF THE INVENTION

Personal computers (PCs) commonly use DRAM memory chips mounted on small, removable memory modules. The original single-inline memory modules (SIMMs) have been replaced with dual-inline memory modules (DIMMs), and 184-pin RIMMs (Rambus inline memory modules) and 184-pin DDR (double data rate) DIMMs.

The memory-module industry is very cost sensitive. Testing costs are significant, especially for higher-density modules. Specialized, high-speed electronic test equipment is expensive, and the greater number of memory cells on high-speed memory modules increases the time spent on the tester, increasing costs.

Handlers for integrated circuits (ICs) have been used for many years in the semiconductor industry. Handlers accept a stack of IC chips that are fed, one at a time, to the tester. The tested IC is then sorted into a "bin" for IC chips that have passed or failed the test.

More recently, handlers have been made for memory modules. U.S. Pat. No. 5,704,489 by Smith, describes in detail a "SIMM/DIMM Board Handler" such as those in use today. FIG. 1 shows a SIMM handler connected to a high-speed electronic tester. Memory modules 18 to be tested are loaded into the top of handler 10 in the input stack. Memory modules 18 drop down, one-by-one, into testing area. Module-under test MUT 20 is next to be tested. Arm 26 pushes MUT 20 laterally until it makes contact with contactor pins 16 that clamp down on "leadless" connector pads formed on the substrate of MUT 20.

Contactor pins 16 are also connected to test head 14, which makes connection to tester 12. Tester 12 executes parametric and functional test programs that determine when MUT 20 falls within specified A.C. and D.C. parameters, and whether all memory bit locations can have both a zero and a one written and read back.

Tester 12 can cost from ten-thousand to millions of dollars. Cost can be reduced if a less-expensive tester replaces tester 12. Since most memory modules are intended for installation on PCs, some manufacturers test memory modules simply by plugging them into SIMM or DIMM sockets on PC motherboards. A test program is then executed on the PC, testing the inserted module. Since PCs cost only about a thousand dollars, tester 12 and handler 10 of FIG. 1 are replaced by a low-cost PC. Equipment costs are thus reduced by a factor of a hundred.

FIG. 2 shows a PC motherboard being used to manually test memory modules. Substrate 30 is a motherboard. Components 42, 44, mounted on the top side of substrate 30, include ICs such as a microprocessor, logic chips, buffers, and peripheral controllers. Sockets for expansion cards 46 are also mounted onto the top or component side of substrate 30.

Memory modules 36 are SIMM or DIMM modules that fit into SIMM/DIMM sockets 38. SIMM/DIMM sockets 38 (hereinafter SIMM sockets 38) have metal pins that fit through holes in substrate 30. These pins are soldered to solder-side 34 of substrate 30 to rigidly attach SIMM sockets to the PC motherboard. Both electrical connection and mechanical support are provided by SIMM sockets 38.

While using PC motherboards for testing memory modules greatly reduces equipment costs, labor costs are increased. Memory modules must be inserted and removed manually. Manual insertion and removal of memory modules is slow and labor-intensive.

The parent application teaches that the component side of the PC motherboard is too crowded for attaching a SIMM/DIMM handler. However, the inventors have realized that the back or solder-side of the PC motherboard is less crowded and provides unobstructed access. The PC motherboard is modified to provide reverse attachment of the handler to the solder-side of the PC motherboard using a handler adapter board. The SIMM socket on the component side of the PC motherboard is removed, and the handler adapter board is plugged from the backside into the holes on the PC motherboard for the SIMM socket.

Handler Mounted Close to PC Motherboard—FIG. 3

FIG. 3 shows that the SIMM/DIMM handler is mounted close to the backside of the PC motherboard using the handler adaptor board. Handler 10 is not drawn to scale since it is several times larger than a PC motherboard. However, FIG. 3 does highlight how handler 10 can fit close to the removed SIMM socket. Such close mounting reduces loading and facilitates high-speed testing.

Contactor pins 16 within handler 10 clamp down onto leadless pads on the edge of module-under-test MUT 20 when arm 26 pushes MUT 20 into place for testing. Contactor pins 16 are electrically connected to connectors on the backside of handler 10. These connectors are edge-type connectors that normally connect with high-speed testers. Typically two connectors are provided. These male-type connectors fit into female-type connectors 54 mounted on handler adaptor board 50. Handler adaptor board 50 contains metal wiring traces formed therein that route signals from connectors 54 to adaptor pins 52 that protrude out the other side of handler adaptor board 50.

Adaptor pins 52 can be plugged into female pins 55 that are soldered onto solder-side 34 of the PC motherboard. Female pins 55 have extensions that fit into the through-holes exposed by removal of the SIMM socket, but also have cup-like receptacles for receiving adaptor pins 52. Using female pins 55 allows handler adaptor board 50 to be easily removed from substrate 30.

Once MUT 20 has been tested by a test program running on the PC motherboard, MUT 20 is sorted and drops down into either good bin 22 or bad bin 24. Sorting is in response to a pass/fail signal from the test program running on the PC motherboard.

Handler adaptor board 50 provides electrical connection from the module-under-test (MUT) in handler 10 to the removed SIMM socket on the PC motherboard. Handler adaptor board 50 provides a slight spacing or offset from the solder-side 34 surface of substrate 30, allowing handler 10 to be plugged directly into connectors 54 on handler adaptor board 50. Since the offset of adaptor board 50 is slight, the length of electrical connections to the handler is short, minimizing added loading on the PC's memory bus. The relatively flat surface of solder-side 34 allows close mounting of the SIMM/DIMM handler to the PC motherboard.

While the invention described in the parent application has been quite effective, further improvements are desired. Handlers are large, bulky machines that have a tendency to jam up, requiring that a technician un-jam the modules in the handler. While such memory-module handlers are useful, the inventors desire to replace the handler with robotic technology. Robotic arms do not suffer from the jamming problem of modules in a gravity-fed handler.

Newer modules contain "tiny" discrete components (resistors, capacitors) used for filtering signals and clocks. These components are sometimes taller than the memory chips on the module. The discrete components can become dislodged as the modules trickle down the input stack of a gravity-fed handler. Depending on how the components are placed on the module, one side of the module may be taller than the other side, creating an "imbalance" on the modules in the stack. This is major cause for jamming and dislocation of small components.

One memory-module handler is needed for each motherboard. These handlers are still somewhat expensive. A parallel test system with many motherboards each with an adaptor board is desired to increase the throughput of the testing system. Automated visual inspection of passed memory modules is also desired. It is desirable to integrate automated visual inspection with the test system, to reduce manual visual checks of the modules. Costs can then be further reduced.

SUMMARY OF THE INVENTION

A parallel test system for testing memory modules has a plurality of motherboards. The motherboards are main boards for computers that use memory modules as a memory.

The motherboards have a component side and a solder side. The component side has integrated circuits mounted thereon and expansion sockets for expansion boards.

Test adaptor boards are mounted to the solder side of the motherboards. The test adaptor boards have test sockets that receive memory modules for testing by the motherboards. Each test adaptor board electrically connects a memory module inserted into the test socket to a motherboard attached to the test adaptor board. The motherboard uses the memory module inserted into the test socket as a portion of the memory of the motherboard.

A main system interface is coupled to the plurality of motherboards. It commands the motherboards to test memory modules inserted into the test sockets and receives test results from the motherboards.

A robotic arm is responsive to commands from the main system interface. It inserts memory modules into the test sockets. Thus the robotic arm inserts memory modules into the test sockets on the test adaptor boards mounted on the solder side of the motherboards.

In further aspects of the invention each motherboard is mounted with the solder side facing upwardly. The expansion boards are below the motherboard. The robotic arm moves above the plurality of motherboards, reaching the test sockets on the test adaptor boards mounted above the solder side of the motherboards. Thus movement of the robotic arm is not obstructed by the expansion boards and integrated circuits mounted on the component side of the motherboards.

In further aspects an input tray holds untested memory modules. The robotic arm picks a memory module from the input tray and inserts the memory module in one of the test sockets for testing by one of the motherboards. An output tray holds tested memory modules. The main system interface commands the robotic arm to pull a memory module from a test socket attached to a motherboard that sent a passing test result to the main system interface and place the memory module on the output tray. Thus the robotic arm moves memory modules from the input tray to motherboards for testing, and moves passing memory modules from the motherboards to the output tray.

In still further aspects of the invention a camera is positioned to capture an image of a memory module held by the robotic arm. An image processor is coupled to receive the image from the camera. It compares the image to a reference image and determining when the image differs sufficiently from the reference image to fail a visual inspection. A VI tray holds memory modules that fail the visual inspection. The robotic arm moves the memory module to the VI tray when the image processor indicates that the memory module failed the visual inspection. Thus visual inspection is performed by the parallel test system. The visual inspection is performed in-transit.

In other aspects the motherboards are personal computer PC main boards and the expansion boards include a network interface expansion board and the plurality of motherboards includes at least 4 motherboards.

DETAILED DESCRIPTION

The present invention relates to an improvement in memory-module robotic testers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 4:
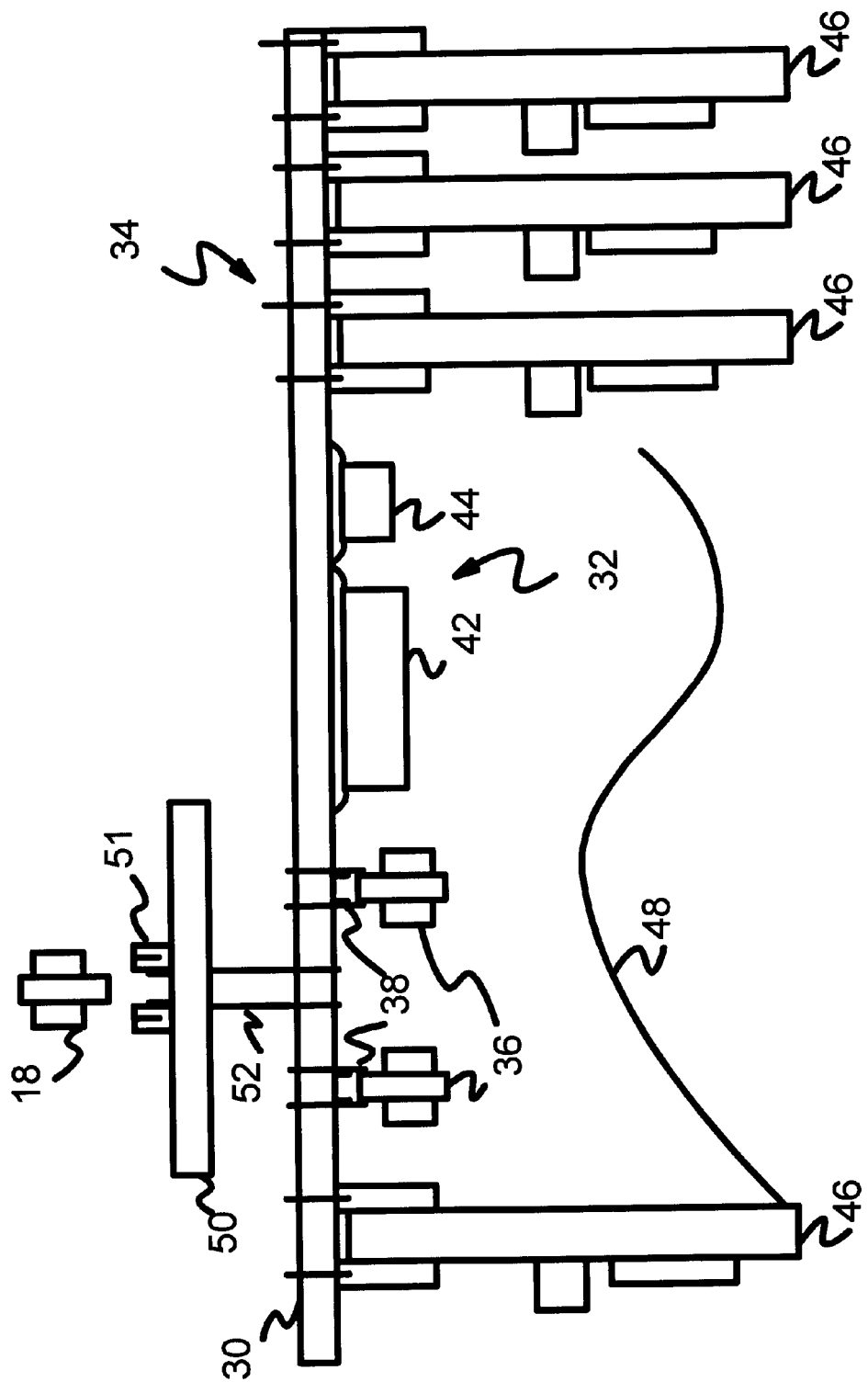
FIG. 4 illustrates a test adapter board with a SIMM/DIMM socket mounted onto the solder-side of a PC motherboard using the original holes for a SIMM or DIMM socket.
Figure 5:
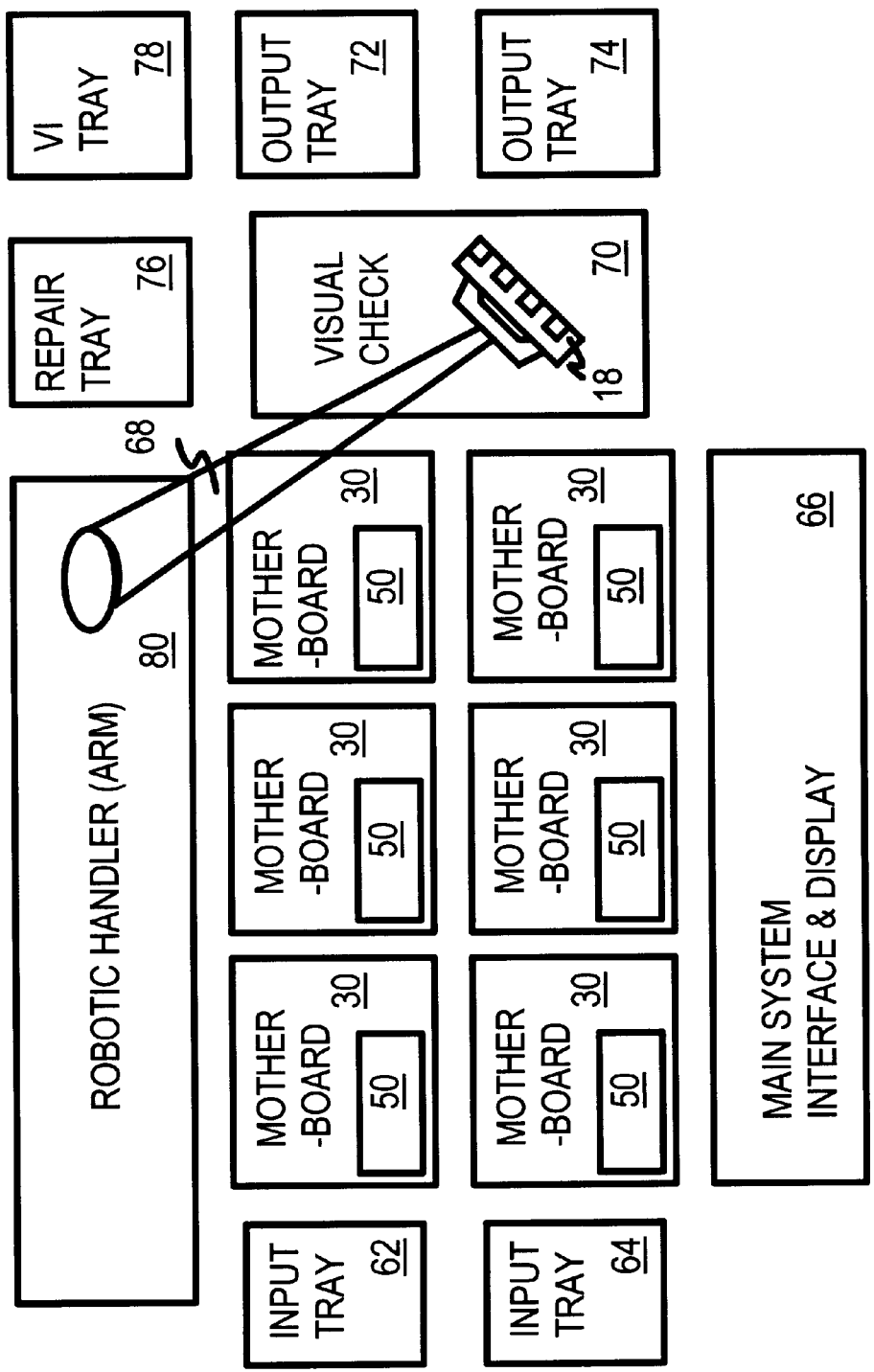
FIG. 5 is an overhead diagram of a test system with multiple upside-down motherboards reached by a robotic arm that inserts memory modules into reverse-mounted adaptor boards.

The inventors have realized that higher test throughputs can be obtained by parallel operation of many motherboards in a single test system. However, simply installing many motherboards each with its own handler is cumbersome. Instead, the handler is replaced with a robotic arm that inserts memory modules into a socket on the adaptor board that is mounted on the reverse (solder-side) of the motherboard. In FIG. 4 one handler was required for each motherboard. However, a single robotic arm can load many motherboards as shown in FIG. 5. Thus many handlers are replaced by a single robotic arm.

Many motherboards are installed on a test station. The motherboards are installed upside-down, with the solder side up and the components down. Each motherboard has an adaptor board mounted on the solder side. The connectors on the adaptor board are replaced with memory-module sockets or other connectors that can accept the memory module directly. The robotic arm picks up a module from an input tray and places the module in the socket on the adaptor board. Once testing is completed, the robotic arm returns to the motherboard, pulls the module out of the socket on the adaptor board, and places the module in an output tray.

Figure 1:
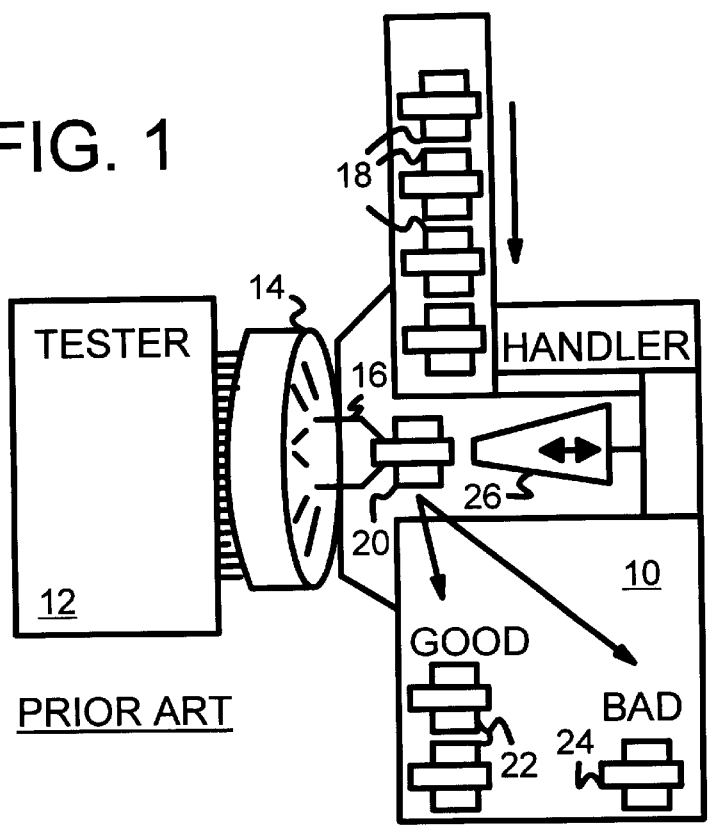
FIG. 1 shows a SIMM handler connected to a high-speed electronic tester.
Figure 2:
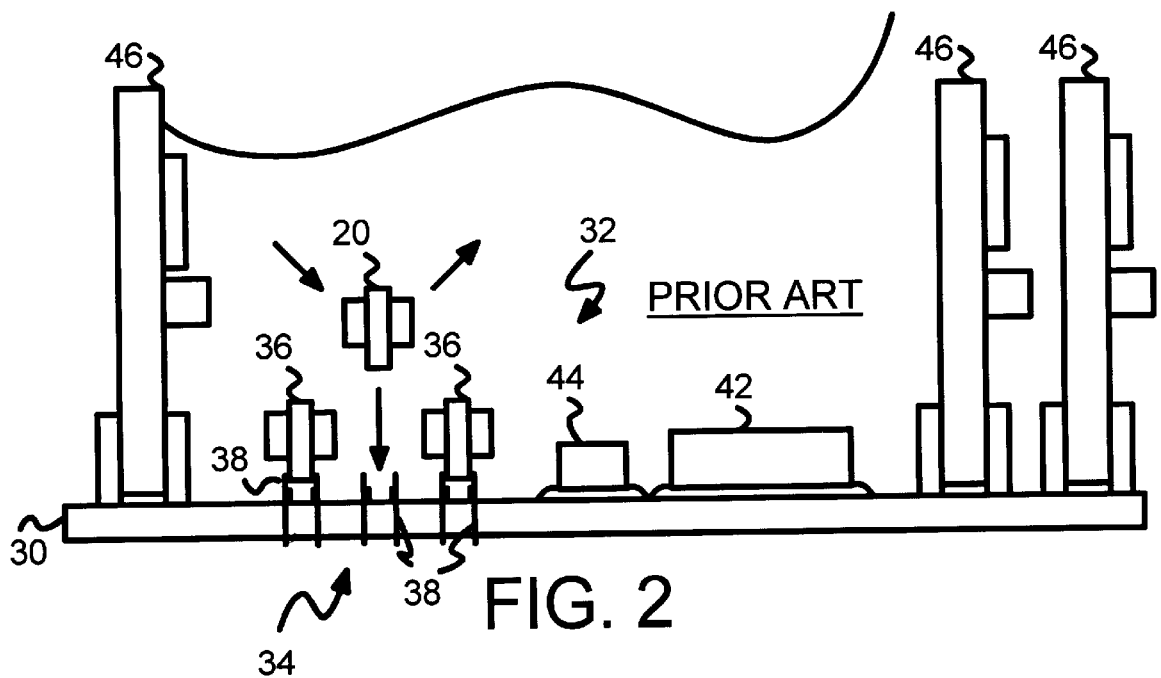
FIG. 2 shows a PC motherboard being used to manually test memory modules.
Figure 3:
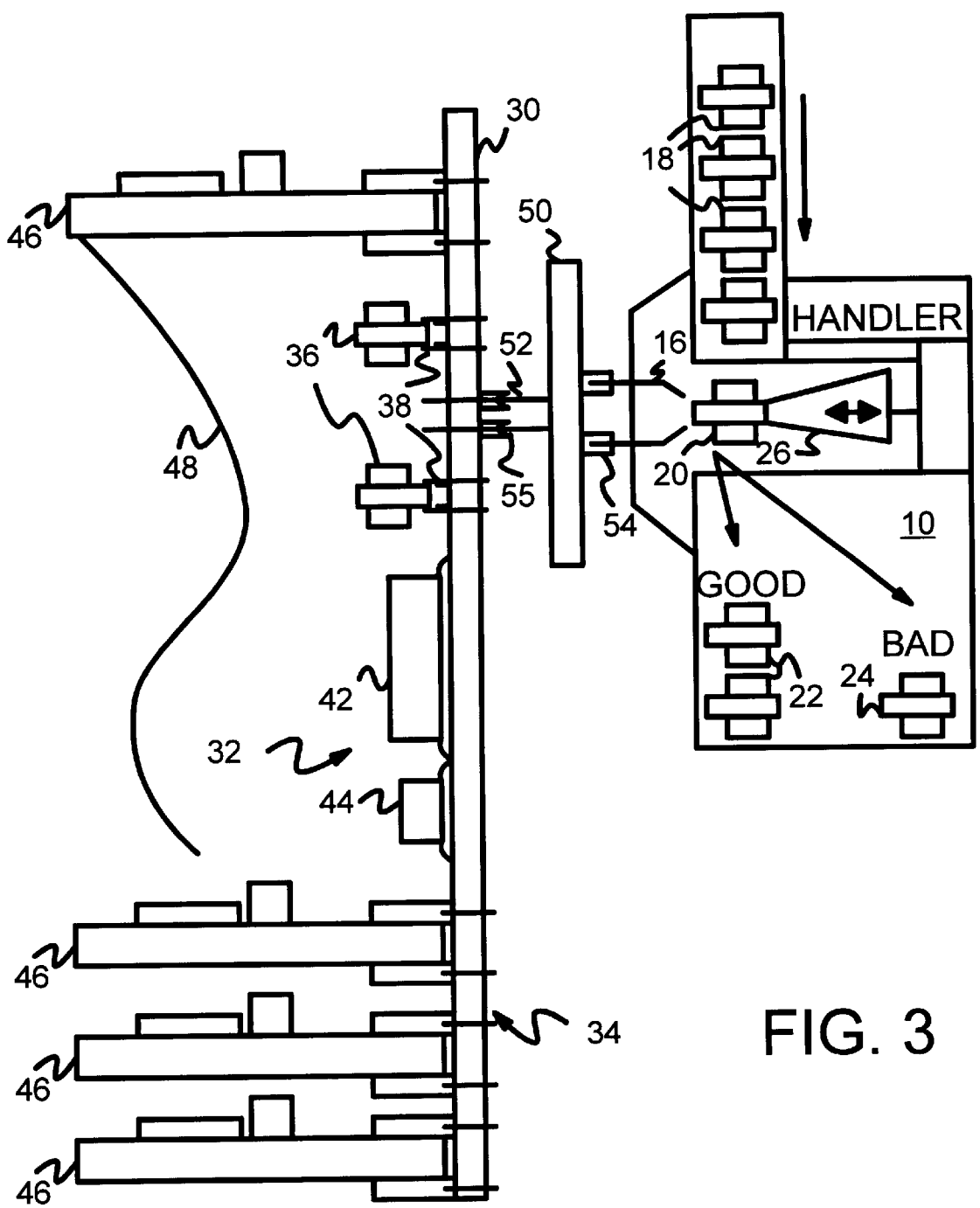
FIG. 3 shows that the SIMM/DIMM handler is mounted close to the backside of the PC motherboard using the handler adaptor board.

The inventors realize that mounting the motherboards upside-down allows the robotic arm free access to the adaptor boards that are mounted on the solder side of the motherboards. Thus the reverse-mounted adaptor board allows the robotic arm unencumbered access for inserting and removing memory modules on the adaptor board. In contrast, if the reverse-mounted adaptor board were not used, the robotic arm would have to navigate through a maze of cables, boards and components to reach the component-side-mounted socket, as shown in FIG. 2. Thus the inventors realize that programming and operation of the robotic arm are much simplified with the reverse-mounted adaptor boards.

Adaptor Board Reverse-Mounted to PC Motherboard—FIG. 4

FIG. 4 illustrates an adapter board with a SIMM/DIMM socket mounted onto the solder-side of a PC motherboard using the original holes for a SIMM or DIMM socket. Substrate 30 of the PC motherboard is a conventional multi-layer epoxy-fiberglass circuit board. Components 42, 44 are mounted on component-side 32 of substrate 30.

Memory modules 36 are SIMM or DIMM modules that fit into SIMM/DIMM sockets 38. SIMM/DIMM sockets 38 (hereinafter SIMM sockets 38) have metal pins that fit through holes in substrate 30. Expansion cards 46 are plugged into expansion sockets that are also mounted onto component-side 32 of substrate 30. Cables 48 and expansion cards 46 obstruct access to memory modules 36. Robotic arm 68 would be unable to insert and remove memory modules from sockets 38 on the component side of substrate 30 due to the obstruction of cables 48 and expansion cards 46.

Test adapter board 50 is a small epoxy-glass circuit board designed to allow robotic arm 68 easy access to SIMM/DIMM test socket 51 that is mounted on adaptor board 50. Test socket 51 on one surface of handler adapter board 50 mates with connectors on SIMM/DIMM memory module 18, the module-under test. The other surface of adaptor board 50 has adapter pins 52 protruding through. These adaptor pins are soldered into through-holes in adaptor board 50. Adapter pins 52 are arranged to have the same arrangement and spacing as the substrate-mounting pins for SIMM sockets 38.

SIMM Socket Removed on Front-Side

One or more of SIMM sockets 38 has been removed from the component side of the PC motherboard, leaving the through-holes. Adapter pins 52 are then fitted through the exposed through holes for the removed SIMM socket. Rather than push the pins through from component-side 32, adapter pins 52 are pushed through from solder-side 34 to component-side 32. Adapter pins 52 are then be soldered to substrate 30.

Test adaptor board 50 provides electrical connection from the module-under-test (MUT) in the SIMM/DIMM test socket 51 to the leads for the removed SIMM socket on the PC motherboard. Test adaptor board 50 provides a slight spacing or offset from the solder-side 34 surface of substrate 30, allowing robotic arm 68 to easily reach test socket 51 and plug memory module 18 under test directly into test socket 51 on adaptor board 50. Since the offset of adaptor board 50 is slight, the length of electrical connections to the motherboard is short, minimizing added loading on the PC's memory bus. Also minimized is signal discontinuity due to the slightly different characteristic impedance compared with the metal traces on substrate. The relatively flat surface of solder-side 34 allows close mounting of SIMM/DIMM test socket 51 to the PC motherboard.

Test Station with Robotic Arm & Many Motherboards—FIG. 5

FIG. 5 is an overhead diagram of a test system with multiple upside-down motherboards reached by a robotic arm that inserts memory modules into reverse-mounted adaptor boards. The test system shown includes six motherboards, each with a motherboard substrate 30 that is mounted upside-down, with the components and expansion cards facing down and the solder side facing up. Each motherboard substrate 30 has a test adaptor board 50 mounted on the solder side. Each test adaptor board 50 connects to the motherboard opposite of where a SIMM socket was removed from the component side. A SIMM/DIMM test socket is mounted on each test adapter board 50, allowing robotic arm 68 to insert and remove a memory module under test.

Robotic handler 80 includes robotic arm 68 that is able to pick up one or more memory modules from input trays 62, 64 and insert a module into the test socket on one of adaptor boards 50. A test program on the motherboard is then activated by host or main system interface 66. Once the test program running on the motherboard is complete, robotic arm 68 moves over the motherboard and picks up the memory module 18 under test. Failed modules are placed on repair tray 76. Two input and two output trays are provided, allowing the operator to swap trays once empty or full while the test system continues operation.

For modules passing the motherboard test, automated visual inspection is then performed by cameras at visual inspection station 70. Robotic arm 68 holds the module 18 at a specific angle and position in relation to one or more cameras, and a machine-vision processor compares the image to a reference image. Irregularities such as dull or shinny spots could indicate cracks or solder blobs. Any such irregularities cause robotic arm 68 to drop the module onto visual-inspect VI tray 78. A human operator can later more carefully inspect the module.

Modules that pass both the motherboard electrical test and the visual test are placed onto output trays 72, 74 by robotic arm 68. These are good modules that have passed the functional test vectors executed when inserted into one of the motherboards and the visual inspection.

Figure 6:
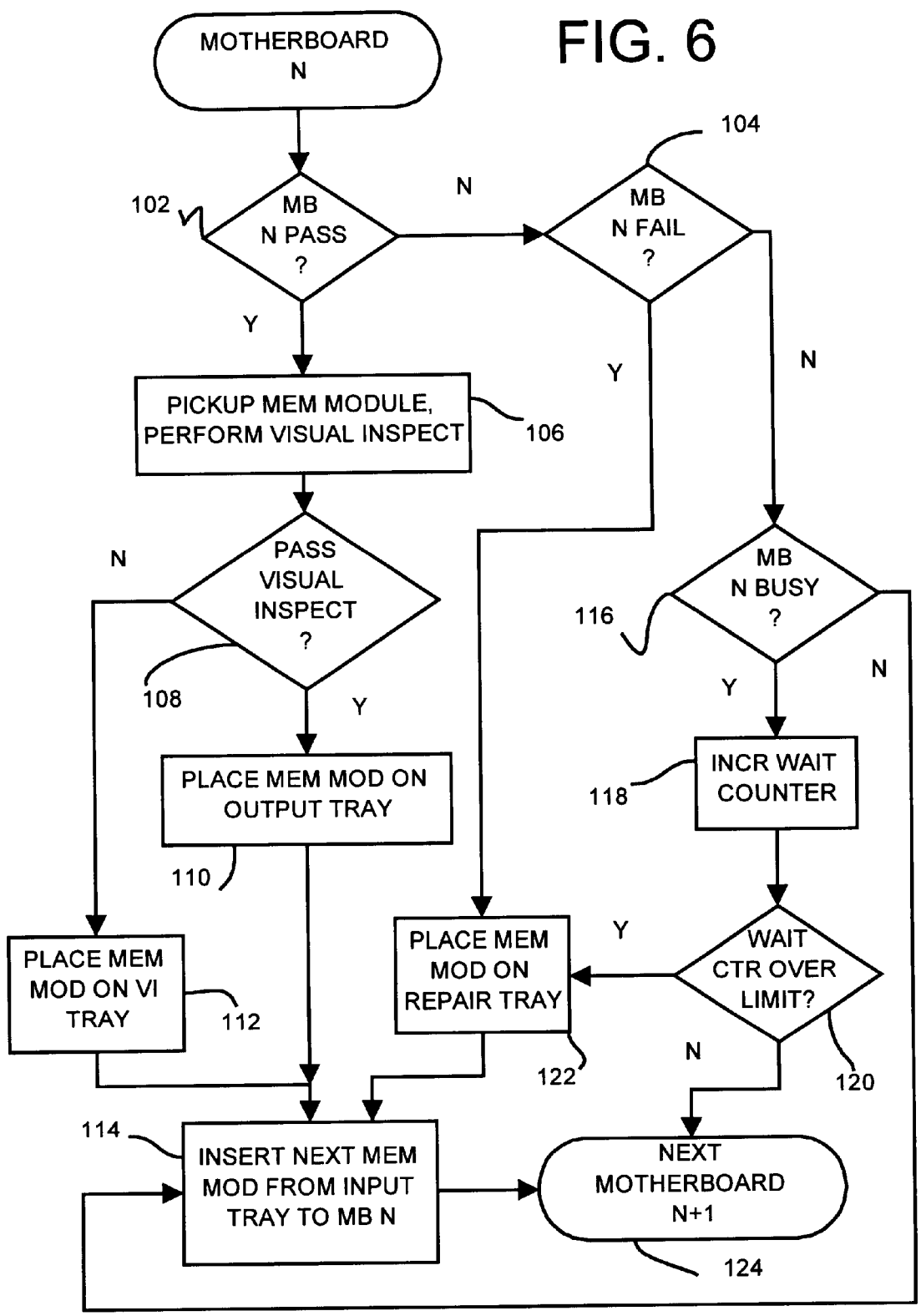
FIG. 6 is a flowchart illustrating the test process.

Process Flow—FIG. 6

FIG. 6 is a flowchart illustrating the test process. The test system host or main interface focuses attention on one motherboard at a time, perhaps selecting motherboards in a clock-wise fashion. For the currently selected motherboard N, the motherboard communicates one of four possible status conditions back to the main system interface. The motherboard can be idle, with no inserted memory module in the test socket, or busy performing a test on a memory module inserted into the motherboard's test socket. When the test is complete, the motherboard has the status pass when the memory module passed the test, or fail when the memory module failed the test.

The main system interface asserts a reset signal to the motherboard when a passed or failed module is removed from the test socket by the robotic handler. A start signal is asserted by the main system interface when a new module is inserted into the test socket to trigger execution of a new test sequence by the motherboard. The main system interface can have separate reset, start, and status signals from each motherboard, or an addressing scheme can be used to select one of the motherboards to receive the commands and send its status.

The main system interface reads the status of motherboard N, step 102, and if the status is pass, the robotic handler is instructed to pick up the memory module from motherboard N's test socket. The robotic handler moves the memory module to the visual inspection location without releasing the module, step 106. Cameras capture images of the module, including both the front and back surfaces of the memory module. An image processor compares the new images to a stored image to find visual defects such as missing, cracked, or damaged components, cold solder blobs, or contamination of metal fingers (leads). New reference images can be scanned in when components on the module are temporarily replaced with equivalent parts.

When the memory module passes the visual inspection, step 108, the robotic arm moves the memory module to the output tray, step 110. The robotic arm releases the module once inserted into the output tray. When the memory module fails the visual inspection, the robotic arm moves the module to the VI tray and releases the module into the tray, step 112. The visual inspection criteria are set to stringent standards, allowing human inspectors to more carefully evaluate borderline modules.

When the status from the motherboard N is fail, step 104, then the robotic handler picks up the module from the test socket and moves it to the repair tray and releases it, step 122. Whenever a module is placed on either the output, VI, or repair tray, steps 110, 112, 122, then the robotic arm moves to the input tray and picks up another untested memory module. This untested module is then moved to motherboard N and inserted into the test socket, step 114. The reset and start signals from the main system interface to motherboard N are then asserted to cause motherboard N to begin the test of the new memory module. The main system interface then moves on to the next motherboard N+1, step 124. The procedure is then repeated on motherboard N+1.

When the status read from motherboard N is busy, step 116, then a wait counter for that motherboard is incremented, step 118. If the wait count exceeds a wait limit, step 120, then the motherboard is reset, the memory module removed by the robotic handler and moved to the repair tray, step 122. A new, untested memory module is then lifted from the input tray and inserted into the test socket for the motherboard, step 114.

When the wait counter does not exceed the wait limit, step 120, then the main system interface allows the motherboard to continue testing the module. The main system interface moves on to the next motherboard, step 124.

Figure 7:
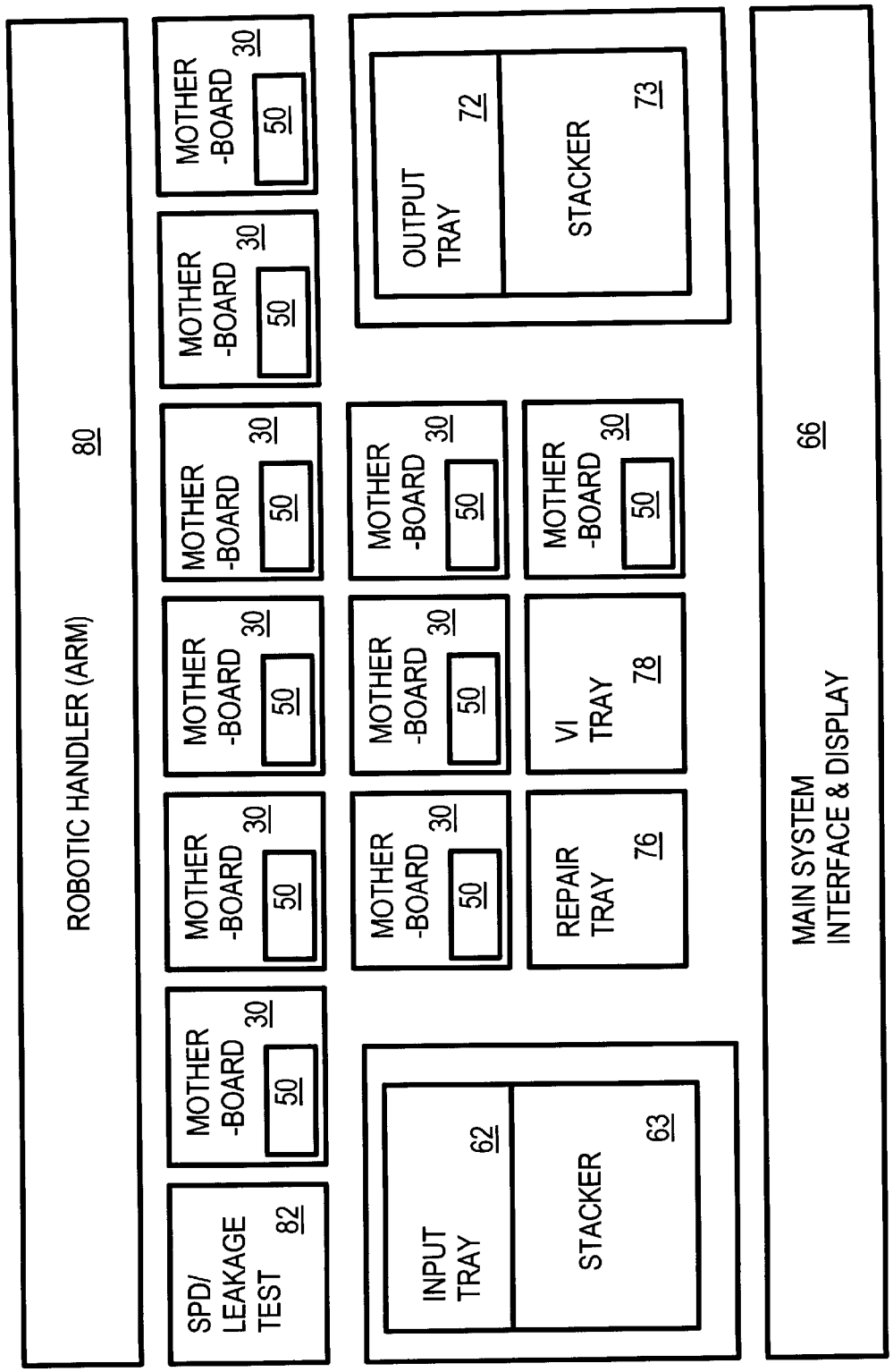
FIG. 7 is a diagram of an expanded multi-motherboard test system with a leakage test board and integrated in-transit visual inspection.

Expanded Test System with Leakage Test—FIG. 7

FIG. 7 is a diagram of an expanded multi-motherboard test system with a leakage test board and integrated in-transit visual inspection. A total of 10 motherboards are fitted into the frame of the test station. Each motherboard substrate 30 has its solder-side facing up, hiding the expansion cards, cables, and components underneath the test-station frame. Each motherboard has a test adaptor board 50 mounted on the solder-side of substrate 30. Each test adaptor board has at least one test socket that can receive a memory module that is inserted by robotic handler 80.

A Yamaichi type connector could be used, but a production-quality connector/socket is preferred due to the low insertion force required. A production quality connector/socket can take more insertions (greater than 100,000 times) than conventional sockets on motherboards (rated for 100 insertions). A production socket also has an ejector normally located at the 2 edges of the socket. This alleviates the ejection of modules for manual as well as robotic handling. A production socket may also contain a V-shape groove. A handler or a robotic arm can drop the module to the V-shape entry, let it settle, and then push the module from the top to the socket. The V shape entry can lower the accuracy requirement to the handler or robotic arm for insertion of the module. Robotic handler 80 can insert and remove memory modules from the test sockets on test adaptor boards 50 without damage to the modules or the test sockets.

The motherboard substrates 30 have holes drilled in them for mounting to a frame of the test station using bolts. Motherboards typically have several sets of mounting holes to allow the same motherboard to be used in different kinds of PC chassis. The frame of the test station is designed to use these mounting holes to hold the motherboards upside-down at roughly bench-top level at the test station.

Main system interface 66 contains a host computer system with an interface to the operator such as a display and a keyboard or bar-code reader. Main system interface 66 controls robotic handler 80 and commands motherboard substrates 30 to begin tests on inserted memory modules. The test results are communicated back to main system interface 66, which instructs robotic handler 80 to move the tested module from the motherboards.

The expanded test system uses a more sophisticated stacker or elevator system for the input and output trays. Trays full of untested memory modules are loaded into stacker 63 in a stack. The tray at the top of the stack is exposed to robotic handler 80, which removes modules from the top tray of input tray 62 for testing by the motherboards. Once the top tray is emptied of modules, the top tray is pushed down to a second stack of empty trays. A new full tray from stacker 63 is slid from the top of the full stack to the top of the empty stack, allowing robotic handler 80 to continuously remove memory modules. The operator merely has to remove empty trays and insert full trays of untested modules.

The empty trays from input stacker 63 are moved over to output stacker 73 by the operator. Output tray 72 likewise operates with stacker 73, pushing empty trays up one stack until exposed to robotic handler 80, which fills the empty trays with tested memory modules. Once a tray is filled, it is pushed down the full stack until the operator removes the full trays. Many variations of automatic tray stacker or elevator systems are known and can be employed.

When robotic handler 80 picks up an untested memory module from input tray 62, the module is first inserted into a test socket in leakage tester 82. Leakage tester 82 performs simple D.C. tests such as for shorts, opens, and excessive leakage. Modules that fail leakage tester 82 are immediately moved to repair tray 76. Modules that pass leakage tester 82 are moved by robotic handler 80 to one of the motherboards for functional testing. Since leakage and other D.C. tests are relatively simple, testing a memory module by leakage tester 82 requires perhaps 5 seconds. In comparison, functional testing by a motherboard can take 30 seconds to 5 or more minutes, depending on the test patterns used and the memory capacity and configuration. Thus one leakage tester 82 can screen modules for many motherboards. Using a separate leakage tester 82 integrated with the test station prevents damage to the motherboards by faulty memory modules.

Once a motherboard has finished testing a module, robotic handler 80 picks the module from the test socket on its test adaptor board 50 and moves the module to a visual inspection position. The visual inspection is performed in-transit, while the robotic arm is still holding on to the module. This saves time in that the robotic arm does not have to re-grip the module after visual inspection. A separate visual inspection station is not needed since the robotic arm merely has to move the module in front of one or more cameras connected to a visual processor. The cameras can capture the image of the module while it is held in the air by the robotic arm.

Modules failing the visual test are placed in VI tray 78, while modules passing both the visual and motherboard-functional test are placed on output tray 72. Modules that fail the motherboard functional test are placed on repair tray 76.

Figure 8:
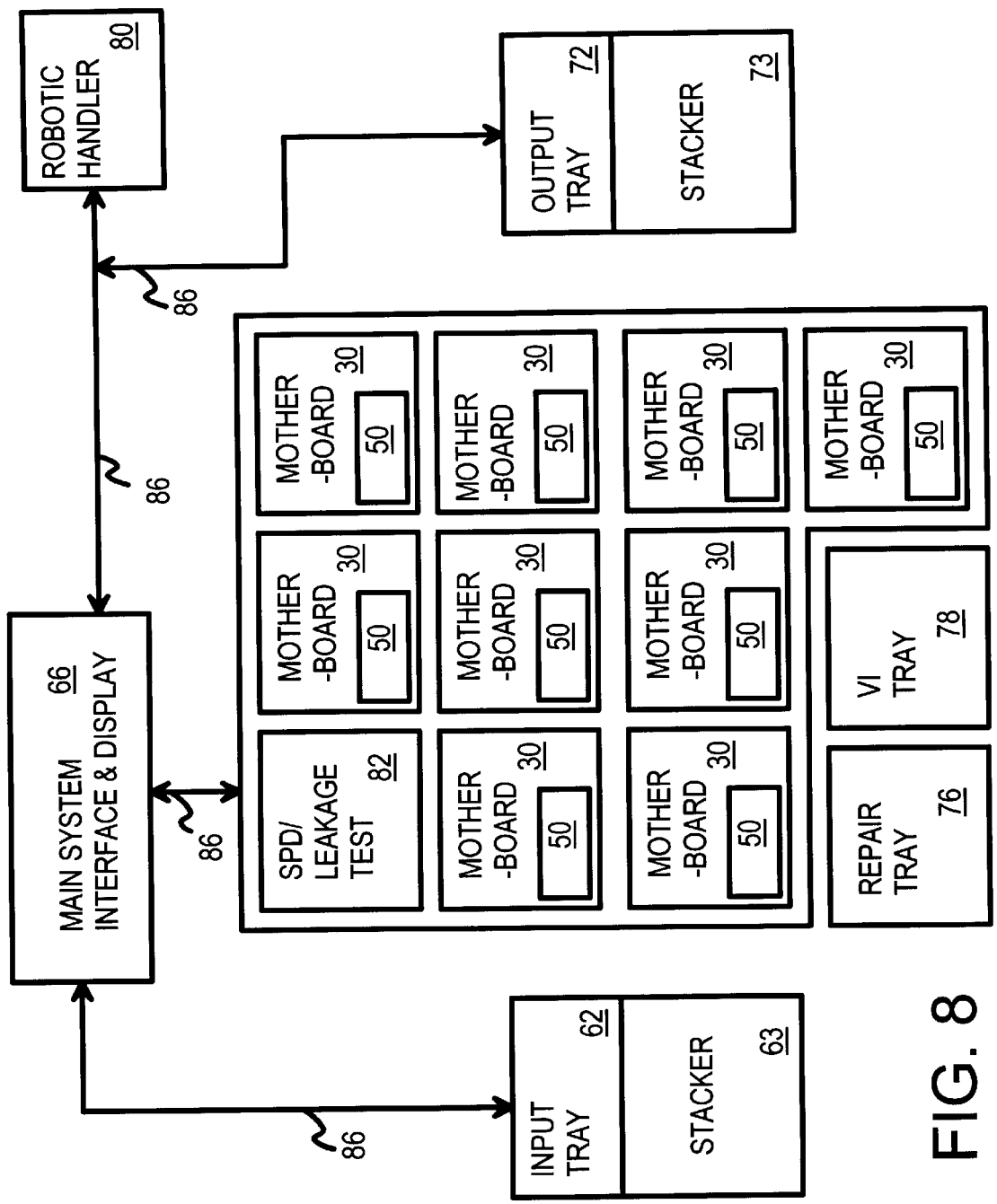
FIG. 8 is a diagram of the electrical interfaces between the multiple motherboards and automated equipment at the test station.

Electrical Interfaces—FIG. 8

FIG. 8 is a diagram of the electrical interfaces between the multiple motherboards and automated equipment at the test station. Main system interface 66 contains a display to the user, displaying statistics such as a log of passing and failing modules, and the status of each motherboard unit. The part number for the modules being tested, and the lot number can be entered by the operator, such as with a keyboard or bar-code scanner.

Main system interface 66 receives the status (pass, fail, busy, idle) from each motherboard substrate 30, and sends reset and start commands to each motherboard. Leakage tester 82 and robotic handler 80 are also controlled by main system interface 66. Interfaces 86 can be RS-232 serial interfaces, or include more complex busses such as Ethernet or USB busses. In particular, the motherboards can be connected together and to main system interface 66 using Ethernet adaptor expansion cards and Ethernet cables connected to a hub.

Input tray 62 and output tray 72, along with stackers 63, 73 are controlled by main system interface 66, which can control movement of the trays. High-level commands are sent to robotic handler 80 by main system interface 66. The high-level commands can include x and y locations of the test sockets on test adaptor boards 50, or the tray locations. Repair tray 76 and VI tray 78 are dumb trays, not requiring any control commands from main system interface 66.

Examples of high level commands include:

Move module from input tray, slot 5 to motherboard 3 (there are 50 slots per stacker tray).
Move module from motherboard 2 to output tray, slot 17.
Move module from leakage tester to repair tray, slot 18.

A high level command may consist of a string of low-level commands. For the example above of the high level command "move from tray to motherboard":

position arm to coordinate x1, y1 of input tray, slot 5 (can be done using a configuration file to specify coordinates).
lower arm in z direction, specified length
Grip module, if no module, report error
Raise arm in z direction, specified length
Position arm to coordinate x2,y2 of motherboard 3, test connector
Lower arm in z direction, specified length
Release module
Pause (for module to settle), push module to test socket
Raise arm in z direction, specified length The system interface can send the high level command or low level commands to the robotic handler. If a high level command is sent, the robotic handler can use a micro-controller to decode the high level command.

Figure 9:
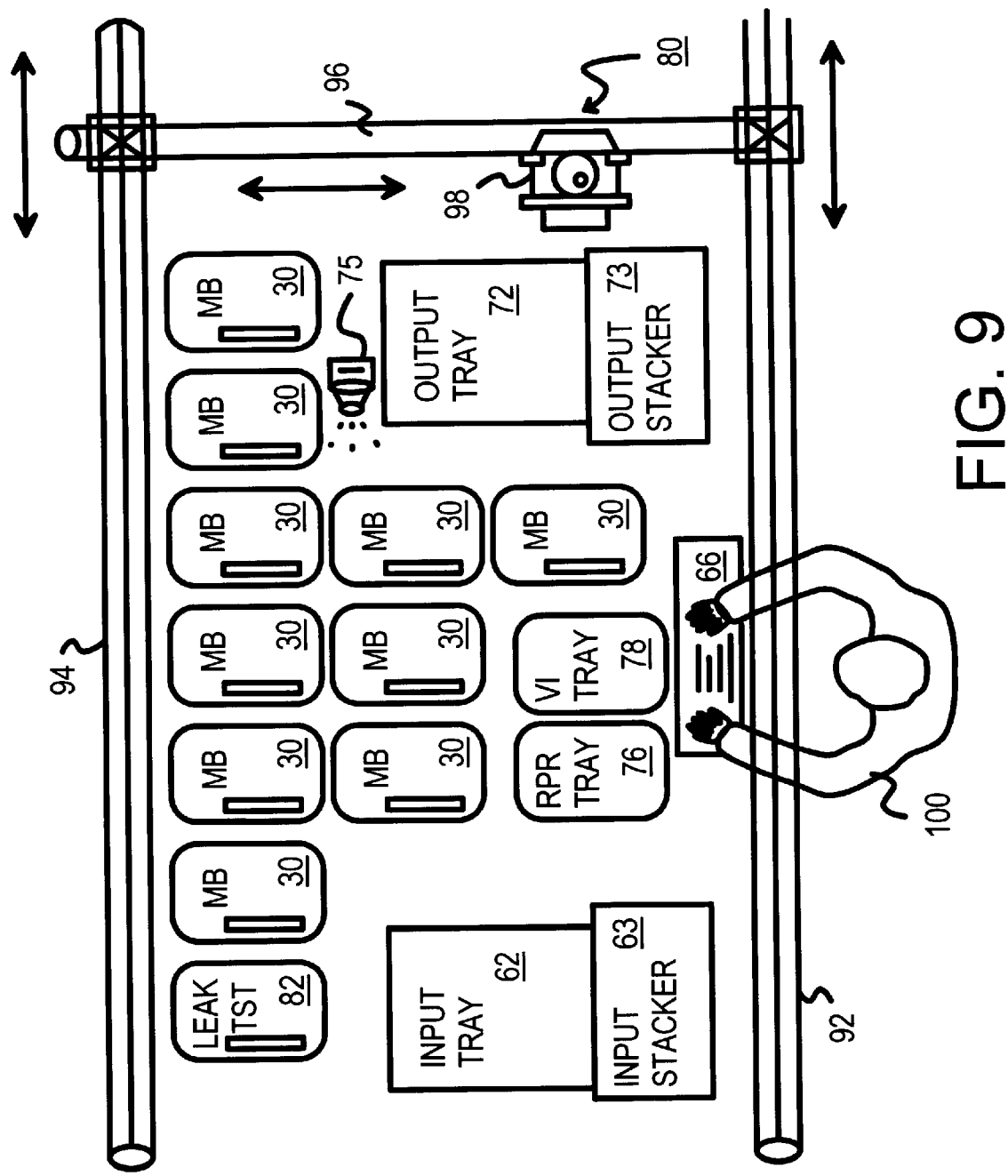
FIG. 9 is an overhead diagram looking down on a multi-motherboard test station with overhead rails for an x-y-z robotic handler.

Overhead Diagram—FIG. 9

FIG. 9 is an overhead diagram looking down on a multi-motherboard test station with overhead rails for an x-y-z robotic handler. The operator 100 can sit in front of the test station, controlling operation with a touch-screen or keyboard. Trays of untested memory modules can include a barcode that is scanned in to main system interface 66 by the operator before the tray is put into input stacker 63. Robotic handler 80 then picks untested modules that are moved over to input tray 62 by stacker 63. The modules are first inserted into leakage tester 82. Modules that pass leakage tester 82 are then moved by robotic handler 80 to the test socket on the test adaptor board on the solder-side of one of motherboard substrates 80 for testing.

Modules that fail the motherboard or leakage test are placed on repair tray 76 by robotic handler 80. Modules passing the motherboard test are pulled from the test socket by robotic handler 80 and moved in front of cameras 75 for visual inspection. Modules failing visual inspection are dropped into VI tray 78. Passing modules are placed on output tray 72 and full trays are moved by stacker 73 to the front of the test station where operator 100 can remove them.

Each of the motherboards fits into a well in the frame of the test station. The test station has a surface at about bench-top level composed of the exposed solder sides of the motherboards in the wells in the frame. Robotic handler 80 rides on rails 92, 94 mounted above the level of the motherboards, such as above the head of a seated operator 100. Operator 100 also replaces repair tray 76 and VI tray 78 with empty trays when full.

A variety of technologies can be used for the robotic arm. A swinging or pivoting arm such as shown in FIG. 5 can be used, with perhaps a telescoping arm extension and a vertical servo at the end of the arm. Alternately, an x-y-z track system can be used as shown in FIG. 9. Fixed rails 92, 94 in the x direction allow movable y-rail 96 to travel in the x direction. Robot arm assembly 98 then travels in the y direction along y-rail 96 until robot arm assembly 98 is directly over the desired position, such as a test socket on an adaptor board, or an input or output tray. An elevator arm on robot arm assembly 98 then moves up and down, pulling out (up) a module or inserting a module into (down) a test socket or tray. Robot arm assembly 98 can also rotate or spin the module into the desired position.

One operator may be able to operate several test stations, depending on how quickly trays need to be inserted and removed. Multiple arms can be attached to robot arm assembly 98, allowing 2 or more memory modules to be picked up and moved at the same time. The test adaptor boards can be modified to have two or more test sockets, allowing two or more modules to be tested at the same time with the same motherboard. The motherboard can then report which of the 2 modules has failed to the main system interface.

ADVANTAGES OF THE INVENTION

While the invention described in the parent application has been quite effective, further improvements are disclosed. The gravity-fed memory-module handlers are replaced with robotic technology. Parallel testing is achieved since one robotic arm can feed modules to many motherboards, each with an adaptor board. This increases the throughput of the testing system. Automated visual inspection of passed memory modules is integrated and performed in transit. Since automated visual inspection is integrated with the test system, manual visual checks of the modules are reduced. Costs can then be further reduced.

Since common PC motherboards form the basis of the test system, a low-cost test apparatus is obtained for testing memory modules. Testing costs are reduced by eliminating the expensive electronic tester. The SIMM/DIMM gravity-feed handler is not needed for each motherboard. Since the modules under test are connected to the PC motherboard without a long cable, loading on the PC's memory bus is minimized, allowing full-speed testing. Higher-speed memories can then be tested. The low profile of the test adapter card to the motherboard allows the module under test to be placed close to the motherboard.

The test adaptor board provides electrical connection from the module-under-test (MUT) to the removed SIMM socket on the PC motherboard. The test adaptor board provides a slight spacing or offset from the solder-side surface of the PC motherboard's substrate, allowing the robotic arm to easily plug modules into the test adaptor boards without navigating around obstructions such as expansion cards, components and cables. Since the offset of the test adaptor board is slight, the length of electrical connections is short, minimizing added loading on the PC's memory bus.

The relatively flat surface of the solder-side of the PC motherboard allows easy, unobstructed access by the robotic arm to the test socket. Removing one or more of the SIMM sockets on the motherboard provides mounting holes for the tester adaptor board, eliminating the need to drill more mounting holes into the PC motherboard substrate. Removing SIMM sockets also reduces capacitive loading on the PC's memory bus.

Some of the SIMM sockets may be left intact on the PC motherboard, allowing memory modules to remain plugged into the PC. These remaining memory modules form a base memory that is used to boot the PC. Thus the PC motherboard can be booted up even when a bad memory module is being tested. This allows for quick error detection and recovery, even when the module under test is faulty. A separate leakage test station provides pre-screening of gross failures before modules are tested with the motherboards.

ALTERNATE EMBODIMENTS

Several other embodiments are contemplated by the inventors. For example, many kinds of memory modules can be tested. Modules using standard DRAM or newer EDO and synchronous DRAM can be tested. The robotic test station is ideally suited for testing the highest-speed memory modules, since capacitive loading is minimized. Other memories such as RAMBUS modules, DDR modules, and PC133 synchronous modules can be tested. Various sizes of memory in the memory module, and form factors for memory modules can be used with the invention, limited by the test adaptor board. Different kinds of test adaptor boards can be substituted. The reverse-mounting of the test adaptor boards and the solder-side up arrangement of the test station allows a technician or operator to easily replace the test adaptor boards when necessary. Non-PC motherboards can also be used. The invention can be applied to any target system board.

The leakage tester can have several test sockets, allowing several memory modules to be tested at once, or only a single test socket. Other trays can be used, such as a leakage-fail tray for receiving memory modules that failed at the leakage tester. The repair and VI trays could be combined, or the modules could be tagged in some way, such as by attaching a label to the modules after testing. Many low-level commands to the robotic arm can be used, or fewer or even one high-level command. Commands can be combined into macro commands or arranged, split, or combined in many different ways. The wait counter can count up from zero, or down from a time limit, incrementing by a negative number. Increments other than one can be used.

A network controller card on the ISA or PCI bus that communicates with the main system interface can be adapted for other buses and is not limited to existing buses. The controller card can be replaced by a standard parallel or serial-port interface to the main system interface. FireWire, USB, or other emerging standards can be used for the interfaces. Many kinds of robotic arms and tracking systems can be employed, with different degrees of motion. Different grasping technologies can be used to hold the memory modules in the robotic arm. Multiple robotic arms that operate in tandem or independently can be used with the test station. For example, one arm can load modules into the motherboards, while a second arm unloads tested modules.

Configuration using serial presence detect (SPD) can also be supported. SPD is a small 256-byte EEPROM that contains the configuration of the module such as the memory type, speed, capacity, latency, DRAM chip arrangement, and other information such as week code, etc. The BIOS during boot-up checks for "serial presence" and determines the memory size and performs a simple memory test. This so-called SPD programming (loading of information into the eeprom) can be done during the leakage test. SPD programming can also be done by the chip-set on the motherboard. But it is preferred to have it done during leakage test. A chipset may not support writing to the eeprom. Preprogramming the SPD before functional test is also better in the sense that the motherboard is independently testing the module based on the SPD data stored on it by a different test equipment.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A parallel test system for testing memory modules comprising:

a plurality of motherboards, the motherboards being main boards for computers using memory modules as a memory, the motherboards having a component side and a solder side, the component side having integrated circuits mounted thereon and expansion sockets for expansion boards;

test adaptor boards, mounted to the solder side of the motherboards, the test adaptor boards having test sockets for receiving memory modules for testing by the motherboards, each test adaptor board for electrically connecting a memory module inserted into the test socket to a motherboard attached to the test adaptor board, the motherboard using the memory module inserted into the test socket as a portion of the memory of the motherboard;

a main system interface, coupled to the plurality of motherboards, for commanding the motherboards to test memory modules inserted into the test sockets and for receiving test results from the motherboards; and a robotic arm, responsive to commands from the main system interface, for inserting memory modules into the test sockets;

whereby the robotic arm inserts memory modules into the test sockets on the test adaptor boards mounted on the solder side of the motherboards.

2. The parallel test system of claim 1 wherein each motherboard is mounted with the solder side facing upwardly, the expansion boards being below the motherboard;

wherein the robotic arm moves above the plurality of motherboards, the robotic arm reaching the test sockets on the test adaptor boards mounted above the solder side of the motherboards, whereby movement of the robotic arm is not obstructed by the expansion boards and integrated circuits mounted on the component side of the motherboards.

3. The parallel test system of claim 2 further comprising:

an input tray for holding untested memory modules, the robotic arm picking a memory module from the input tray and inserting the memory module in one of the test sockets for testing by one of the motherboards; and an output tray for holding tested memory modules, wherein the main system interface commands the robotic arm to pull a memory module from a test socket attached to a motherboard that sent a passing test result to the main system interface and place the memory module on the output tray, whereby the robotic arm moves memory modules from the input tray to motherboards for testing, and moves passing memory modules from the motherboards to the output tray.

4. The parallel test system of claim 3 further comprising:

a repair tray for holding faulty memory modules, the main system interface commanding the robotic arm to pull a memory module from a test socket attached to a motherboard that sent a failing test result to the main system interface and place the memory module on the repair tray, whereby failing memory modules are moved by the robotic arm to the repair tray.

5. The parallel test system of claim 4 further comprising:

a camera, positioned to capture an image of a memory module held by the robotic arm;

an image processor, coupled to receive the image from the camera, for comparing the image to a reference image and determining when the image differs sufficiently from the reference image to fail a visual inspection;

a VI tray for holding memory modules that fail the visual inspection;

wherein the robotic arm moves the memory module to the VI tray when the image processor indicates that the memory module failed the visual inspection, whereby visual inspection is performed by the parallel test system.

6. The parallel test system of claim 5 wherein the visual inspection is performed immediately after the robotic arm pulls the memory module from the test socket for a motherboard but before the robotic arm places the memory module on the output tray, whereby the visual inspection is performed in-transit.

7. The parallel test system of claim 2 wherein the robotic arm is attached to a robotic arm assembly that travels in a length direction on a y-rail, and travels in a width direction on an x-rail, the robotic arm moving the memory module up and down to remove and insert the memory module from the test socket, whereby the robotic arm is an x-y-z tracked robotic system.

8. The parallel test system of claim 2 further comprising:

a second robotic arm, controlled by the main system interface, for moving memory modules for testing by the plurality of motherboards, whereby two robotic arms are used.

9. The parallel test system of claim 2 wherein the motherboards are personal computer PC main boards and the expansion boards include a network interface expansion board and the plurality of motherboards includes at least 4 motherboards, whereby the parallel test system capable of testing at least 4 memory modules at one time.

10. The parallel test system of claim 3 wherein the input and output trays are coupled to stackers, the stackers for moving multiple trays of memory modules for exposing memory modules to the robotic arm.

11. The parallel test system of claim 3 further comprising:

a leakage tester, coupled to the main system interface, having a test socket for receiving a memory module inserted by the robotic arm, the leakage tester for performing leakage tests on the memory module before the robotic arm moves the memory module to the motherboards for functional testing, whereby leakage testing is performed before functional testing by the motherboards.

12. The parallel test system of claim 11 wherein the leakage tester performs serial presence detect SPD programming.

13. A method for testing memory modules using motherboards at a robotic test station comprising:

for each motherboard in a plurality of motherboards communicating with a main system interface:

when the motherboard reports a passed-test status to the main system interface:

commanding a robotic device to pick up a tested memory module from a test socket on a test adaptor board that electrically connects the tested memory module to the motherboard;

commanding the robotic device to move the tested memory module to an output tray, and to place the tested memory module in the output tray;

commanding the robotic device to pick up an untested memory module and move the untested memory module to the motherboard, the robotic device inserting the untested memory module into the test socket for the motherboard;

resetting the motherboard and initializing a test program on the motherboard, the test program testing the untested memory module;

when the motherboard reports a failed-test status to the main system interface:

commanding a robotic device to pick up the tested memory module from the test socket on the test adaptor board that electrically connects the tested memory module to the motherboard;

commanding the robotic device to move the tested memory module to a repair tray, and to place the tested memory module in the repair tray;

commanding the robotic device to pick up an untested memory module and move the untested memory module to the motherboard, the robotic device inserting the untested memory module into the test socket for the motherboard; and resetting the motherboard and initializing a test program on the motherboard, the test program testing the untested memory module;

whereby the robotic device inserts and removes memory modules from test sockets on test adaptor boards attached to the plurality motherboards at the robotic test station.

14. The method of claim 13 wherein when the motherboard reports a passed-test status to the main system interface:

capturing an image of the tested memory module as the robotic device moves the tested memory module from the motherboard to the output tray;

comparing the image to a reference image and signaling a visual failure when the image differs by a predetermined amount from the reference image;

commanding the robotic device to divert the tested memory module from the output tray to a VI tray when the visual failure is signaled, whereby in-transit visual inspection is performed.

15. The method of claim 13 wherein commanding the robotic device to pick up the untested memory module, and move the untested memory module to the motherboard further comprises:

(1) commanding the robotic device to move to an input tray and pick up the untested memory module from the input tray;

commanding the robotic device to move the untested memory module to a leakage tester and insert the untested memory module into a test socket at the leakage tester;

commanding the leakage tester to perform a leakage test on the untested memory module;

when the leakage tester reports that the untested memory module has passed the leakage test, commanding the robotic device to pick up the untested memory module from the test socket on the leakage tester and move the untested memory module to the motherboard, the robotic device inserting the untested memory module into the test socket on the test adaptor board at the motherboard;

when the leakage tester reports that the untested memory module has failed the leakage test, commanding the robotic device to pick up the untested memory module from the test socket on the leakage tester and move the untested memory module to the repair tray, and commanding repeating from step (1) with another untested memory module from the input tray, whereby the leakage test is performed before testing by the motherboards.

16. The method of claim 13 further comprising:

when the motherboard reports a busy status to the main system interface:

incrementing a wait counter for the motherboard;

when the wait counter exceeds a wait limit:

ending testing of the tested memory module by the motherboard;

commanding the robotic device to pick up the tested memory module from the test socket on the test adaptor board that electrically connects the tested memory module to the motherboard;

commanding the robotic device to move the tested memory module to the repair tray, and to place the tested memory module in the repair tray;

commanding the robotic device to pick up an untested memory module and move the untested memory module to the motherboard, the robotic device inserting the untested memory module into the test socket for the motherboard; and resetting the motherboard and initializing a test program on the motherboard, the test program testing the untested memory module;

whereby testing is halted when the wait limit is exceeded.

17. A robotic multiple-motherboard memory tester comprising:

main system means for controlling testing of memory modules on multiple motherboards;

motherboard means, controlled by the main system means, for executing a test program on a memory module inserted into a test socket means;

test adaptor board means, mounted on the motherboard means, for electrically connecting the test socket means to a memory bus means on the motherboard;

output means for receiving memory modules that have passed the test program; and robotic means, controlled by the main system means, for grasping a memory module and inserting the memory module into the test socket means, the robotic means also for grasping and removing the memory module from the test socket means after completion of the test program, and moving the memory module to the output means when the motherboard indicates to the main system means that the memory module has passed the test program;

wherein the robotic multiple-motherboard memory tester has a plurality of the motherboard means, each motherboard means having an attached test adaptor board means with a test socket means, each motherboard means for executing the test program on a different memory module in parallel with other motherboard means, whereby parallel testing of memory modules is performed.

18. The robotic multiple-motherboard memory tester of claim 17 further comprising:

visual inspection means, coupled to the robotic means, for capturing an image means for representing a visual image of the memory module, for determining when the image means fails inspection;

whereby visual inspection is performed.

19. The robotic multiple-motherboard memory tester of claim 18 wherein the visual inspection means further includes command means for commanding the robotic means to divert the memory module to a visual tray means for receiving memory modules that fail inspection.

20. The robotic multiple-motherboard memory tester of claim 19 wherein the motherboard means has a component-side means for mounting many components mounted thereon, and a reverse-side being relatively free of components;

wherein the test adaptor board means is mounted to the reverse-side and not to the component-side means, whereby the test adaptor board means is reverse-mounted.

* * * * *